United States Patent [19]

Higuchi

[11] Patent Number: 5,571,455
[45] Date of Patent: Nov. 5, 1996

[54] COMPOSITION FOR FORMING ELECTROCONDUCTIVE PATTERN AND PROCESS FOR PRODUCING THE SAME

[75] Inventor: Naoshige Higuchi, Tokyo-to, Japan

[73] Assignee: Dai Nippon Insatsu Kabushiki Kaisha, Tokyo-to, Japan

[21] Appl. No.: 422,608

[22] Filed: Apr. 13, 1995

Related U.S. Application Data

[63] Continuation of Ser. No. 114,238, Sep. 1, 1993, abandoned, which is a continuation of Ser. No. 684,937, filed as PCT/JP90/01102, Aug. 30, 1990, abandoned.

[30] Foreign Application Priority Data

Aug. 31, 1989 [JP] Japan ................................. 1-226304
Jun. 21, 1990 [JP] Japan ................................. 2-163612

[51] Int. Cl.⁶ .......................... C09D 5/25; H01B 1/16
[52] U.S. Cl. .................... 252/513; 252/518; 252/512; 427/25; 427/13; 427/23; 501/17; 501/19; 501/20
[58] Field of Search ..................... 252/513, 518, 252/512; 427/25, 13, 23; 501/17, 19, 20

[56] References Cited

U.S. PATENT DOCUMENTS 4,070,517 1/1978 Beckman .......................... 428/209
4,079,156 3/1978 Youtsey et al. .................... 252/513

FOREIGN PATENT DOCUMENTS 130010 1/1985 European Pat. Off. .
2511395 11/1975 Germany ......................... 427/25
56-135846 10/1981 Japan .
60-16041 4/1985 Japan .
1-13793 1/1989 Japan ............................. 427/25

*Primary Examiner*—Melissa Bonner
*Attorney, Agent, or Firm*—Foley & Lardner

[57] ABSTRACT

The present invention relates to a composition for forming an electroconductive pattern excellent in electroconductivity, comprising as main components (a) an alloy powder which is obtained by cooling and finely dividing an eutectic mixture comprising 99.5%–94.5% by weight of nickel and 0.5%–5.5% by weight of boron, (b) a glass frit and (c) an organic vehicle, and a process for forming an electroconductive pattern with the composition.

15 Claims, 3 Drawing Sheets

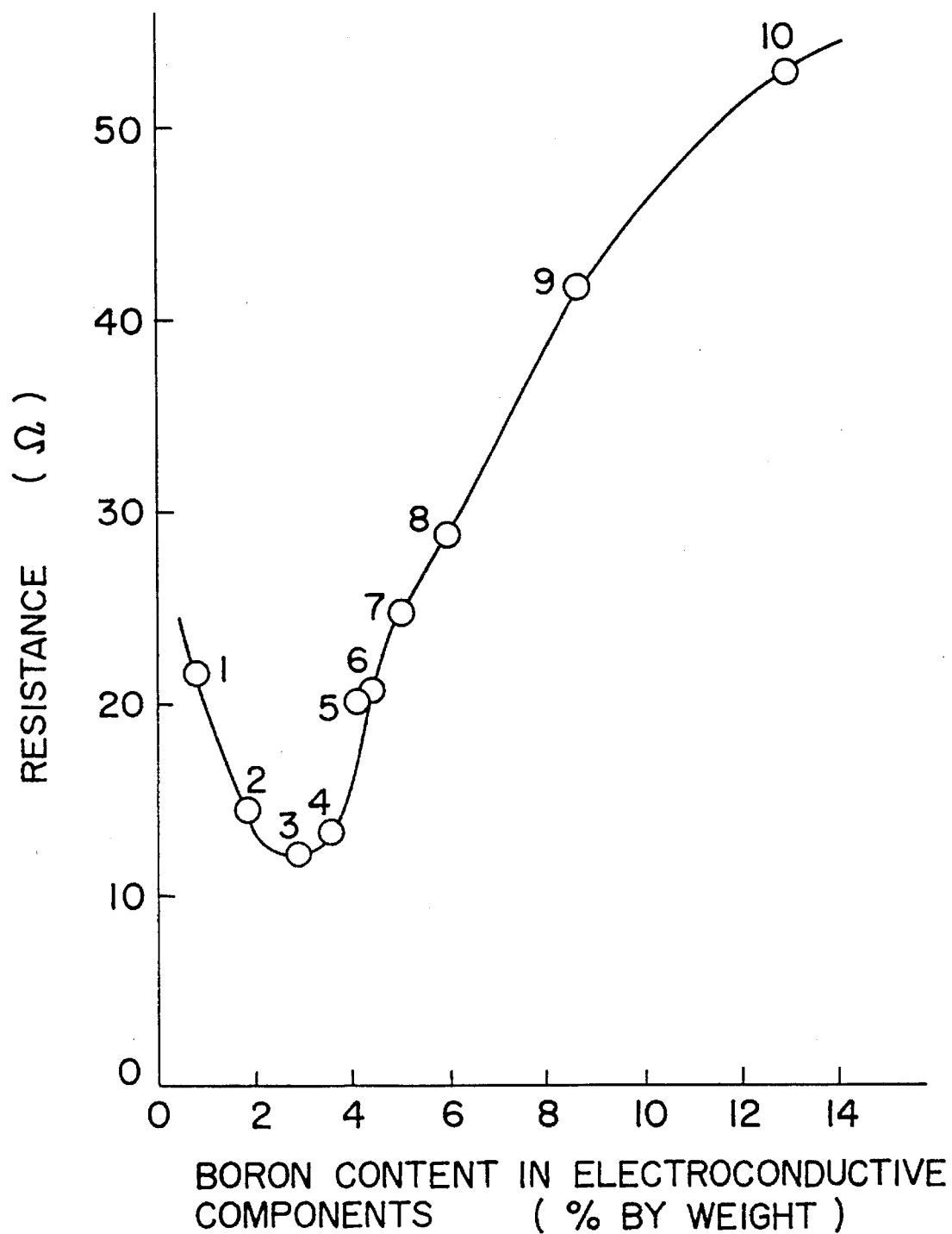
F I G. 1

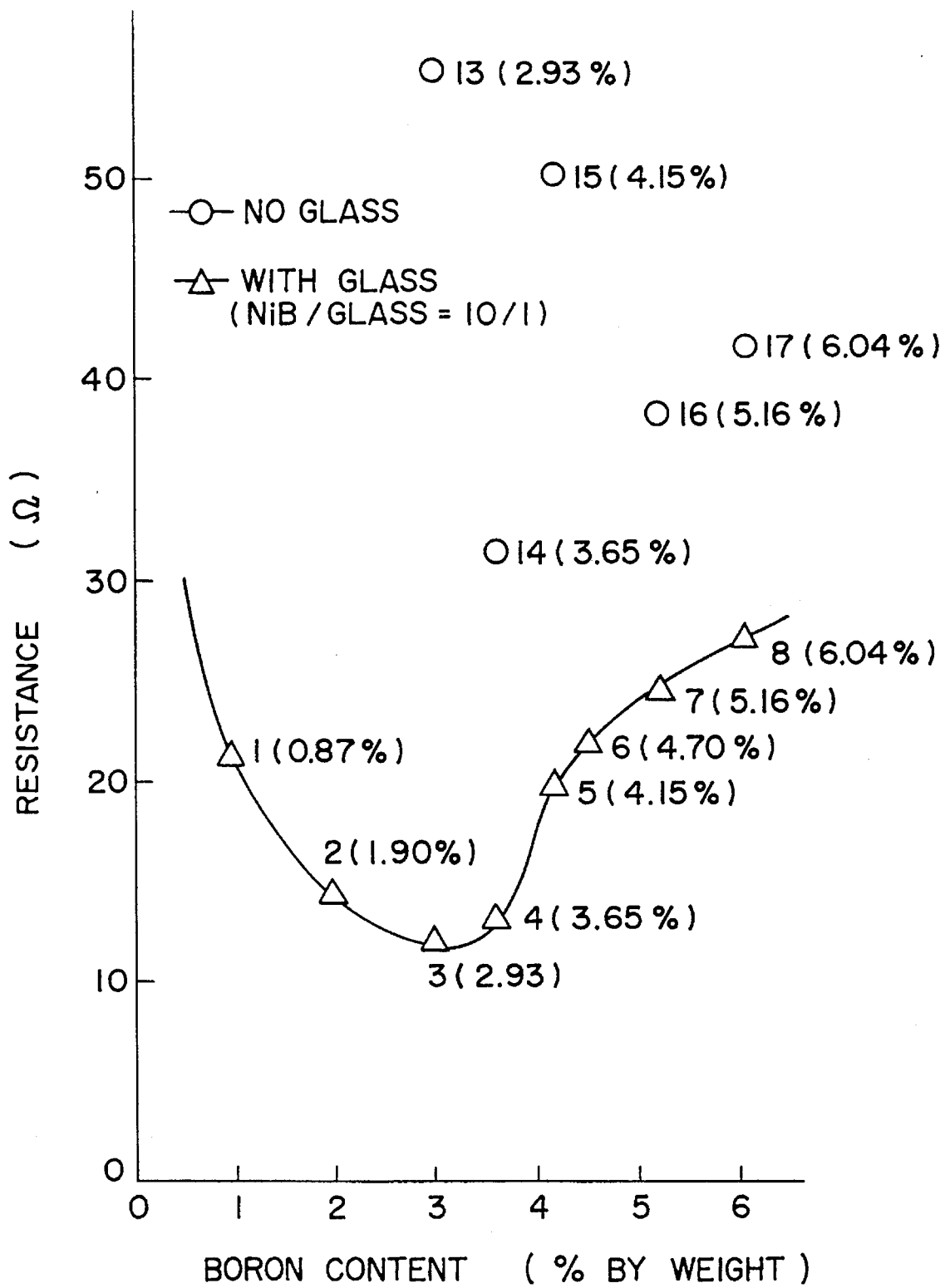
F I G. 3

COMPOSITION FOR FORMING ELECTROCONDUCTIVE PATTERN AND PROCESS FOR PRODUCING THE SAME

This application is a continuation of application Ser. No. 08/114,238, filed Sep. 1, 1993, now abandoned, which is a continuation of Ser. No. 07/684,937 filed as PCT/JP90/01102 Aug. 30, 1990 now abandoned.

TECHNICAL FIELD

The present invention relates to a composition for forming electroconductive pattern and process for producing it. Particularly, it relates to a composition for forming an electroconductive pattern suitable for a base for plasma displays and a process for forming the electroconductive pattern.

BACKGROUND TECHNIQUE

Bases for plasma displays are produced by patterning a composition for forming an electroconductive pattern on a substrate material by means of a thick film printing such as screen printing and endowing with electroconductivity by calcination.

Hitherto, products in the form of paste in which finely divided metal particles and glass frits are dispersed into an inert organic vehicle have been provided as the electroconductive pattern. Particularly in a base for plasma displays, nickel powder has been employed as the metal powder owing to their excellent anti-sputtering properties.

Recently, there have also been developed compositions for forming electroconductive patterns in which phosphorus or silicon is incorporated into a nickel-boron alloy ($Ni_3B$) with the view of improving of their resistance to oxidation on calcination (U.S. Pat. No. 3,943,168 and Japanese Patent Publication No. 5521/1986).

Lately, plasma displays are developed and marketed with the inclination toward the enlargement of their size and the decrease of their pitches to form a fine pitch. The larger the displays, the longer their electrodes. Also, if it is intended to decrease the pitches, the electrode should be formed in a thinner shape. Thus, requirements for the electroconductivity of electrode materials are increased. As one of the methods for increasing the emission brightness of plasma displays, there are a memory driving method. However, in this case a plurality of plasma discharge currents are converged into one electrode, and therefore it is required for the electrode material to have a higher electroconductivity.

It is however the present situation in compositions for forming electroconductive patterns which have been provided at present that, while these compositions have anti-oxidation property of the nickel metal on the formation of the electroconductive pattern (calcination) in air, the electroconductivity of the calcined product obtained is insufficient and thus is not satisfactory for the enlargement of the size, the increase of pitches and the formation of memory of the plasma displays.

On the other hand, in small size plasma displays, it is also required for compositions for forming electroconductive patterns which have been provided at present to increase the thickness of a pattern or to thicken the pattern as much as possible for the purpose of substantially lowering the resistance of the electrode, and such requirements restrict the structures and properties of the plasma displays. Moreover, materials to be used and steps for production increases in the production of the plasma displays, and further the cost also increases.

DISCLOSURE OF THE INVENTION

The object of the present invention is to provide a composition for forming an electroconductive pattern which has a high electroconductivity and has no unevenness of calcination and a process for forming the electroconductive pattern.

The composition for forming the electroconductive pattern of the present invention comprises an alloy powder which is obtained by cooling and finely dividing an eutectic mixture comprising 99.5%–94.5% by weight of nickel and 0.5%–5.5% by weight of boron, a glass frit and an organic vehicle.

Also, the process for forming the electroconductive pattern of the present invention is characterized in that an alloy powder which is obtained by cooling and finely dividing an eutectic mixture comprising 99.5%–94.5% by weight of nickel and 0.5%–5.5% by weight of boron, a glass frit and an organic vehicle are kneaded to form a paste, which is next printed on a substrate in the form of a pattern with a printing means and then calcinated by heating, or that each of the surface of an alloy powder which is obtained by cooling and finely dividing an eutectic mixture comprising 99.5%–94.5% by weight of nickel and 0.5%–5.5% by weight of boron and a glass frit powder is coated with an organic resin insulating layer and these coated powder are mixed to form a toner, which is then transferred on the substrate in the form of a pattern with an electrostatic means and calcinated by heating to form an electroconductive pattern.

BRIEF DESCRIPTION OF THE DRAWINGS

FIGS. 1, 2 and 3 are graphs which demonstrate the relationship between the content of boron and the resistance in an electroconductive component, respectively.

BEST MODE OF CARRYING OUT THE INVENTION

Figure 2:
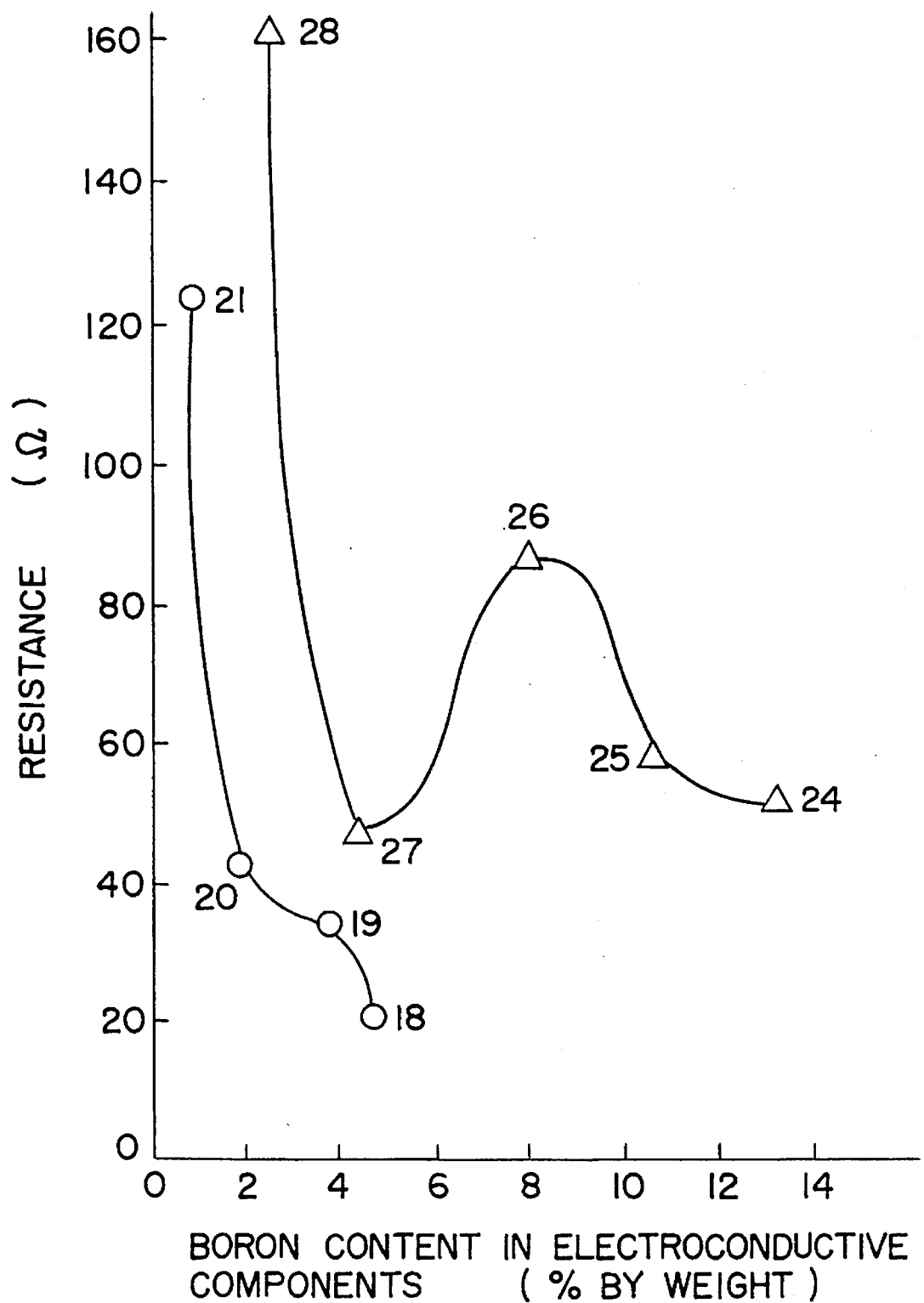

The alloy powder in the present composition for forming the electroconductive pattern is described.

First of all, as a nickel component in the alloy powder, there can be used a nickel simple substance, a nickel-boron alloy or the like and a boron simple substance or boric acid are used as a boron component, these raw materials being mixed and melted to form the alloy.

As the melting temperature, it is required to use a temperature of at least 1450° C., preferably 1500° C. or more in consideration of the nickel simple substance has a melting point of about 1450° C. and the nickel-boron alloy has a melting point of 1000° C. or more.

The alloy is prepared by heating the components with a heating means such as high-frequency heating in a heat-resistant container such as an alumina crucible in air or in an inert gas stream such as argon.

If the alloy has a boron content of 0.5% by weight or less or 5.5% by weight or more, the electroconductivity of the electroconductive pattern formed by calcination is lowered. The content of boron is preferably in the range of 1.5–4.0% by weight, more preferably in the range of 2.0–3.7% by weight.

The alloy powder in the present invention is preferably of a substantially spherical shape and has a particle size of 10 μm or less with the view to improve the printability and the electroconductivity after calcination.

In time of the preparation of the alloy powder, if the alloy has a nickel content in the range of 99.5%–94.5% by weight, it is difficult to prepare the powder with a finely dividing means such as a conventional mechanical grinding method because of its high ductility. As an alternative method, there is a finely dividing method by atomization, and it is possible to pulverize the alloy. However, a conventionally employed atomization method gives only a very low yield in spite of the classification of the atomized particles to select particles having desired particle diameters and it is not practical for obtaining the finely divided alloy powder because of the very high cost.

Therefore, it is preferable to use a pulverized product with use of a method such as the water-atomization method which is disclosed in Japanese Patent No. 552253 and Japanese Patent Laid-Open Publication No. 152605/1985 in order to prepare an alloy powder suitable for the present invention. In the water-atomization method, the pulverization is simultaneously conducted with the process for quenching the melted metal, so that it is not always necessary to prepare preliminarily an ingot unlike the finely dividing method by pulverization. Moreover, the alloy powder finely divided by the water-atomization method is preferably classified further by a suitable means to adjust the particle diameter to 10 μm or less.

Also, the glass frit powder comprises PbO, $SiO_2$ and $B_2O_3$, and it is required to use the one having a softening point and a thermal expansion coefficient in an appropriate value. For instance, it has been found that in the case where the calcination temperature is 600° C., a glass frit having a softening point in the range of 400° C.–550° C. is preferably used, particularly when the glass frit having a softening point in the range of 500° C.–550° C. is used, calcination can be conducted with little unevenness.

In other words, when the softening temperature of the glass frit is too low as compared with the calcination temperature, the organic vehicle cannot be evaporated and as a result the organic vehicle component tends to remain; when a glass frit having a high softening point is used, the organic vehicle can be removed easily and the acceptable range of the content of the glass frit can be widened. If the glass frit has an unevenness of calcination, such unevenness is not desirable because it may cause the nonuniformity of electroconductivity as well as the nonuniformity of the discharge initiating voltage of a panel made of the glass frit and the residual material may also cause the decrease of the panel life.

Thus, the calcination property can be improved and the uneven calcination can successfully be decreased by selecting a glass frit corresponding to a calcination temperature. For instance, it is possible to intend the improvement of the life of a panel which is used as a base for a plasma display.

When a soda float glass is used as a substrate or a base material of a base for a plasma display, the glass frit has preferably a thermal expansion coefficient in the range of about from $70 \times 10^{-7}$/° C. to $90 \times 10^{-7}$/° C.

The glass frit powder should have a particle diameter in the range of 10 μm or less in the same manner as the alloy powder, and it is finely divided by a mechanical means and classified to control the particle diameter.

The glass frit powder is preferably used in a proportion of 1 part by weight to 40 parts by weight per 100 parts by weight of the alloy powder.

As the organic vehicle, which is inert to the alloy powder or the glass frit and is incinerated away by calcination, there are used cellulose resins such as ethyl cellulose and cellulose nitrate, acrylic resins and the like. These resins are used as a solution of a solvent such as terpineol, butyl carbitol or butyl carbitol acetate. The weight ratio of the resin and the solvent used is preferably in a proportion of 4 to 20 per 1 of the resin.

The organic vehicle is preferably in a proportion of 10% by weight to 30% by weight in a composition for forming the electroconductive pattern.

The method for forming the electroconductive pattern of the present invention includes the method by a printing means and the method by electrostatic transfer.

First, as the method by a printing means, the composition for forming the electroconductive pattern is prepared by dispersing the alloy powder and the glass frit into an inert organic vehicle and kneading them with a mill such as a three-roll mill. In this case, well-known additives such as a surface active agent, a levelling agent or an anti-foaming agent may be added according to the necessity.

The composition for forming the electroconductive pattern is patterned on a substrate by screen printing or other patterning means. The substrate includes glass, glass-ceramic and ceramic plates, and a soda float glass or the like is used.

According to the process by screen printing, patterning is conducted with a screen printing plate which has an orifice in the shape of a certain pattern on the plate material, and a paste for printing is laminated on the substrate through the orifice with a squeegee.

The printed paste is dried and fixed at 90° C.–200° C., and when soda float glass is used as a substrate, it is further calcinated at 550° C.–620° C. to form an electroconductive pattern. Calcination is carried out in air, and it may be also conducted in a nitrogen atmosphere or a reducing atmosphere. The inert organic vehicle and various additives are incinerated by calcination, and the alloy powder is fixed on the substrate by the glass frit to form an electroconductive pattern.

As is well-known, the screen printing plate, on which mesh a photosensitive resin is patterned, acts as a mask of a paste for printing. Accordingly, there is used only a powder having a particle diameter much smaller than the diameter of the orifice of the mesh which is used for the screen printing plate. The mesh size of a screen printing plate used in a fine pattern such as an electrode of a plasma display is generally in the range of 250/inch or less, and thus the powder in the paste is required to have a particle diameter of 25 μm or less, preferably 10 μm or less. When the alloy powder is finely divided to form a composition for printing, the paste increases the thixotropic property and thus can be applied for the fine pattern printing. Furthermore, the alloy powder is preferably in the shape of sphere. The shape of the alloy powder influences largely the rheology of the paste. Thus, when the alloy powder is spherical, it is possible to raise the filling ability of the alloy powder in the printing pattern and to improve further the electroconductivity, and it is also possible to make the printability of the paste excellent.

The electroconductive pattern of the present invention can be also formed by electrostatic transfer.

The composition for forming the electroconductive pattern used in electrostatic transfer is formed into a toner which may be patterned with an electrostatic means by coating each surface of the alloy powder and the glass frit powder with an insulating resin. As the insulating resin, there are an acrylic resin, a vinyl chloride resin, a polystyrene resin and the like. The resin preferably has a film thickness of 0.1 μm 5 μm.

The composition for forming the electroconductive pattern is preferably formed by mixing 1 part by weight to 40 parts by weight of the glass powder with 100 parts by weight of the alloy powder, these powder having been coated with the insulating layer.

Patterning of the toner thus prepared on a substrate is conducted, for example, by permitting the composition for forming the electroconductive pattern of the present invention to adhere to a photosensitive element having been charged in the form of a pattern to be formed and then electrostatically transferring it on a soda float glass substrate. Finally, the transferred composition is calcined to form the electroconductive pattern under the same condition as the case of its formation by the printing means as described above.

The composition for forming the electroconductive pattern of the present invention comprises an alloy powder obtained by cooling and finely dividing an eutectic mixture which contains many electroconductive components, a glass frit and an organic vehicle. The electroconductive pattern formed by the composition maintains resistance to oxidation and at the same time exhibits an excellent electroconductivity owing to the presence of much amount of a nickel component. It is considered that when the electroconductive pattern is first used as a base for a plasma display, it will exhibit an excellent resistance to sputtering.

When the present composition for forming the electroconductive pattern is incorporated with the glass frit, the adhesion of the alloy powder is reinforced and the electroconductivity is increased.

By forming the alloy powder in a spherical shape, it is also possible to raise the filling ability of the alloy powder on the formation of the electroconductive pattern thereby to improve the electroconductivity, and it is also possible to make the printability of the paste excellent. When the alloy powder is finely divided to 10 μm or less, the thixotropic properties of a paste for screen printing can be improved and the printability can be also improved. Particularly, an electrode for a plasma display suitable for the printing of a fine pattern can be obtained.

The present invention is described below with reference to Examples.

EXAMPLE 1

A nickel-boron alloy (containing 15% by weight of boron) and a nickel simple substance were placed in an alumina crucible and melted by heating at a temperature of 1500° C. by means of high-frequency heating in an atmospheric condition.

The alloy in the melted state was finely divided by the water-atomization method.

Next, the particle diameter was controlled by air classification to give nickel-boron alloy having boron contents of 0.87, 1.90, 2.93, 3.65, 4.15, 4.70, 5.16, 6.04, 8.7 and 13.2% by weight, respectively.

The alloy powders thus obtained was in the shape of sphere on their observation with an electron microscope and had a mean particle diameter of 6 μm measured with a laser diffraction type particle size analyzer manufactured by Microtrac Co.

The alloy and a glass frit (manufactured by NIPPON DENKI GARASU K.K., Japan; GA-8, components: PbO, SiO$_2$, B$_2$O$_3$; density: 5.38 g/cm$^3$, thermal expansion coefficient: 81.0×10$^{-7}$/° C.; softening point: 490° C.; particle diameter: 5 μm) were kneaded with a varnish [ethyl cellulose:butyl carbitol acetate =1:9 (weight ratio)] with a three-roll mill so that the paste had an alloy content of 75.8% by weight and a glass frit of 7.6% by weight, and the paste was next screen-printed in a line pattern having a width of 200 μm, a length of 90 mm and a thickness of 20 μm on a float glass plate. The printed paste was dried at 150° C. for 10 minutes to remove butyl carbitol acetate and then calcined in air in a continuous calcination furnace under a condition of a peak temperature of 600° C. and a retention time of 10 minutes.

Electric resistance between the both ends of the electroconductive pattern was measured with a digital tester. The results are shown in Table 1 and also illustrated in FIG. 1. In this connection, numerals in FIG. 1 refer to experiment numbers.

TABLE 1

| Experiment No. | Content of boron in alloy (% by weight) | Resistance (Ω) |
| --- | --- | --- |
| 1 | 0.87 | 21.8 |
| 2 | 1.90 | 14.6 |
| 3 | 2.93 | 12.2 |
| 4 | 3.65 | 13.3 |
| 5 | 4.15 | 20.0 |
| 6 | 4.70 | 20.6 |
| 7 | 5.16 | 24.6 |
| 8 | 6.04 | 28.6 |
| 9 | 8.70 | 41.1 |
| 10 | 13.2 | 52.2 |

Experiment Nos. 1–7 were conducted with reference to the composition for forming the electroconductive pattern of the present invention. As apparent from the table, the nickel-boron compositions of the present invention have low resistances and are excellent compositions for forming electroconductive patterns. Moreover, it is understood that in experiment Nos. 2 4, the patterns have low resistances and very excellent electroconductive patterns are obtained at the boron content in the range of 1.5–4.0% by weight. Thus, it was unexpected that boron brings about a peaked effect in a range of special amount.

Further, the compositions for forming electroconductive patterns were prepared as Experiment Nos. 11–17 without the use of the glass frit by incorporating 83.3% by weight of the alloys having the same boron contents as those in Experiment Nos. 1–5, 7 and 8, respectively, with 16.6% by weight of the varnish. Then, electroconductive patterns were prepared in the same manner as above-described Experiments, and resistance were measured for these patterns. The results are shown in Table 2.

TABLE 2

| Experiment No. | Content of boron in alloy (% by weight) | Resistance (Ω) |
| --- | --- | --- |
| 11 | 0.87 | ∞ |
| 12 | 1.90 | ∞ |
| 13 | 2.93 | 55.1 |
| 14 | 3.65 | 31.5 |
| 15 | 4.15 | 50.0 |
| 16 | 5.16 | 38.3 |
| 17 | 6.04 | 41.5 |

As shown in Table 2, it is understood that electroconductivity is lowered in the absence of the glass frit.

In this connection, FIG. 3 is a graphical illustration of a part of the data in Example 1 in order to explain Example 1 more detailedly and indicates that when the glass frit is contained, resistance is remarkably lowered on the ratio of boron at about 3% by weight (Experiment Nos. 1–8)

On the other hand, it is understood that when the glass frit is not contained, the aforementioned inclination does not appear even on the same ratio of boron as above (Experiment Nos. 13–17).

Comparative Example 1

Nickel simple substance was melted in an alumina crucible in an atmospheric circumstance by high-frequency heat at 1500° C., and spherical nickel powder having a particle diameter of 5 μm was prepared by the water-atomization method in the same manner as in Example 1.

With this nickel powder, a nickel-boron alloy powder having a boron content of 4.7% by weight (prepared by the water-atomization method in the same manner as in Example 1) was mixed in mixing ratios (% by weight) shown in Table 3. Each of the mixtures were incorporated with 7.6% by weight of the glass frit and 16.6% by weight of the varnish used in Example 1 to prepare a composition for forming an electroconductive pattern. Electroconductive patterns were formed in the same manner as in Example 1, and their resistance was measured. The results are shown in Table 3 and also illustrated in FIG. 2, in which numerals refers to experiment numbers.

TABLE 3

| Experiment No. | Content of metal powder (% by weight) | | Resistance (Ω) |
|---|---|---|---|
| | Nickel-boron alloy | Nickel | |
| 18 | 75.8 | 0 | 20.6 |
| 19 | 60.6 | 15.2 | 34.6 |
| 20 | 45.5 | 30.3 | 43.1 |
| 21 | 30.3 | 45.5 | 124.0 |
| 22 | 15.2 | 60.6 | ∞ |
| 23 | 0 | 75.8 | ∞ |

Experiment No. 18 in Table 3 refers to the composition for forming the electroconductive pattern of the present invention which is the same as Experiment No. 6, and Experiment Nos. 19–23 refer to Comparative Examples. It is thus understood that the mixture of the nickel-boron alloy and the nickel simple substance is used as the metal component of the composition for forming the electroconductive pattern, the electroconductive pattern formed exhibits higher resistance.

Comparative Example 2

A nickel-boron alloy containing 13.2% by weight of boron was used in place of the nickel-boron alloy used in the aforementioned Comparative Example 1. Electroconductive patterns were formed in the same manner as in Comparative Example 1, and their resistance was measured. The results are shown in Table 4 and also illustrated in FIG. 2, in which numerals refers to experiment numbers.

TABLE 4

| Experiment No. | Content of metal powder (% by weight) | | Resistance (Ω) |
|---|---|---|---|
| | Nickel-boron alloy | Nickel | |
| 24 | 75.8 | 0 | 52.2 |
| 25 | 60.6 | 15.2 | 58.5 |
| 26 | 45.5 | 30.3 | 87.0 |
| 27 | 30.3 | 45.5 | 47.2 |
| 28 | 15.2 | 60.6 | 161.0 |

All of Experiment Nos. 24–28 in Table 4 refer to comparative example. It is understood that the electroconductive patterns formed exhibit lower electroconductivities as compared with the electroconductive pattern obtained from the composition for forming the electroconductive pattern of the present invention.

EXAMPLE 2

Compositions for forming electroconductive patterns were prepared in the same manner as in Example with a constant content (16.6% by weight) of the varnish used in Example 1 while the contents of the nickel-boron alloy powder containing 2.93% by weight of boron which was prepared in Example 1 and the glass frit used in Example 1 were varied as shown in Table 5 below. Electroconductive patterns were then formed in the same manner as in Example 1, their resistance was measured and examination was also conducted for the presence of their uneven calcination with an eye.

The results are shown in Table 5.

TABLE 5

| Experiment | Content of metal (% by weight) | | Resistance (Ω) | Uneven calcination |
|---|---|---|---|---|
| | Nickel-boron alloy | Glass frit | | |
| 29 | 81.6 | 1.7 | 17 | none |
| 30 | 80.0 | 3.3 | 14 | none |
| 31 | 78.3 | 5.0 | 12.5 | none |
| 32 | 76.6 | 6.7 | 10.5 | none |
| 33 | 75.0 | 8.3 | 10.5 | found |
| 34 | 73.3 | 10.0 | 10 | found |
| 35 | 71.6 | 11.7 | 10 | found |
| 36 | 70.0 | 13.3 | 10 | found |
| 37 | 68.3 | 15.0 | 10 | found |
| 38 | 66.6 | 16.7 | 12.5 | found |

As apparent from Table 5, uneven calcination is generated when the content of the glass frit is increased.

EXAMPLE 3

A glass frit having a softening point different from that of the glass frit used in Example 2 (manufactured by IWAKI GLASS K. K., Japan; trade name: TO-72; thermal expansion coefficient; $70 \times 10^{-7}$/° C.; softening point; 525° C.; particle diameter; 5 μm) was used, and a composition for forming an electroconductive pattern was prepared in the same manner as in Example 2. Electroconductive patterns were then formed in the same manner as in Example 1, their resistance was measured and examination was also conducted for the presence of their uneven calcination with an eye.

The results are shown in Table 6.

TABLE 6

| Experiment | Content of metal (% by weight) | | Resistance (Ω) | Uneven calcination |
|---|---|---|---|---|
| | Nickel-boron alloy | Glass frit | | |
| 39 | 80.0 | 3.3 | 23 | none |
| 40 | 78.3 | 5.0 | 16.0 | none |
| 41 | 76.6 | 6.7 | 13.5 | none |
| 42 | 75.0 | 8.3 | 14 | none |
| 43 | 73.3 | 10.0 | 15 | none |
| 44 | 71.6 | 11.7 | 12.5 | none |
| 45 | 70.0 | 13.3 | 11.5 | none |

TABLE 6-continued

| Experiment | Content of metal (% by weight) | | Resistance (Ω) | Uneven calcination |
|---|---|---|---|---|
| | Nickel-boron alloy | Glass frit | | |
| 46 | 68.3 | 15.0 | 11.5 | none |
| 47 | 66.6 | 16.7 | 11 | none |
| 48 | 65.0 | 18.3 | 11 | none |
| 49 | 63.3 | 20.0 | 12.5 | found |
| 50 | 61.6 | 21.7 | 15 | found |
| 51 | 60.0 | 23.3 | 12.5 | found |
| 52 | 58.3 | 25.0 | 14 | found |

As apparent from Table 5, when a glass frit having a high softening point is used as the glass frit, an electroconductive pattern having a low resistance can be formed and an electroconductive pattern can also be formed without uneven calcination.

EXAMPLE 4

The alloy powder prepared in Example 1 (having a boron content of 2.93% by weight, a particle diameter of 6 μm and a spherical shape) and a finely divided powder of an acrylic resin (SOKEN KAGAKU K.K., Japan, MP-4951) were treated with a mechanofusion system (HOSOKAWA MICRON K.K., Japan) to coat the alloy powder with the acrylic resin at a film thickness of 1 μm.

In the same manner, the glass frit used in Example 1 (NIPPON DENKI GARASU K.K., Japan; GA-8) was coated with the acrylic resin at a film thickness of 1 μm.

The alloy powder and the glass frit powder were mixed with each other at a mixing ratio of 10:1 (by weight) to make a toner.

Next, after an electrostatic latent image was formed on a selenium drum (photosensitive material), it was developed with the toner prepared above and electrostatically transferred on a soda float glass base material to form a pattern having a width of 200 μm, a length of 90 μm and a thickness of 20 μm. A plasma display base on which an electroconductive pattern was form was successfully prepared by subjected the pattern to calcination treatment in the same manner as in Example 1.

When electric resistance of the electroconductive pattern was measured, the similar result to Example 1 was obtained.

INDUSTRIAL APPLICABILITY

The present invention is widely used as a composition for forming an electroconductive pattern in the case of preparing a panel for plasma displays and a process for forming an electroconductive pattern with the composition.

I claim:

1. A composition for forming an electroconductive pattern, comprising:
    (a) an alloy powder which is obtained by cooling and finely dividing an eutectic mixture consisting of from 96.3% to 98.0% by weight of nickel and from 2.0% to 3.7% by weight of boron, said eutectic mixture being prepared by melting at a temperature of at least 1450° C.;
    (b) a glass frit having a softening point in the range of 400°–550° C.; and
    (c) an organic vehicle, the decomposition temperature of the organic vehicle being lower than the softening point of the glass frit.

2. A composition for forming an electroconductive pattern according to claim 1, wherein 1–40 parts by weight of the glass frit is blended with 100 parts by weight of said alloy powder.

3. A composition for forming an electroconductive pattern according to claim 1, wherein the particles of said alloy powder is nearly spherical in shape and has a particle diameter of 10 μm or less.

4. A composition as claimed in claim 1 wherein the amount by weight of boron in the alloy powder is about 3.0% and the amount by weight of nickel in the alloy powder is about 97.0%.

5. A composition as claimed in claim 4 wherein the amount by weight of boron in the alloy powder is 2.93% and the amount by weight of nickel in the alloy powder is 97.07%.

6. A composition as claimed in claim 1 wherein the amount by weight of nickel is from 97.07% to 96.35% and the amount by weight of boron is from 2.93% to 3.65% by weight of boron.

7. A process for forming an electroconductive pattern, comprising the steps of:
    coating the surface of (a) an alloy powder which is obtained by cooling and finely dividing an eutectic mixture consisting of from 96.3% to 98.0% by weight of nickel and from 2.0% to 3.7% by weight of boron with an organic resin insulating layer, said eutectic mixture being prepared by melting at a temperature of at least 1450° C.;
    coating the surface of (b) a glass frit having a softening point in the range of 400°–550° C. with an organic resin insulating layer, the decomposition temperature of the organic resin being lower than the softening point of the glass frit;
    mixing the thus coated alloy powder and glass frit to form a toner;
    adhering the thus obtained toner to a photosensitive element having been charged in the form of a pattern to be formed;
    electrostatically transferring the toner formed on the photosensitive element onto a substrate in the form of the pattern by an electrostatic means; and
    heating to calcine the pattern to obtain the electroconductive pattern.

8. A process forming an electroconductive pattern according to claim 7, wherein said alloy powder is formed by the water-atomization method.

9. A process for forming an electroconductive pattern according to claim 8, wherein 1–40 parts by weigh of he glass frit is blended with 100 parts by weight of said alloy powder.

10. A process for forming an electroconductive pattern according to claim 8, wherein the particles of said alloy powder is nearly spherical in shape and has a particle diameter of 10 μm or less.

11. A process as claimed in claim 7 wherein the amount by weight of boron in the alloy powder is about 3.0% and the amount by weight of nickel in the alloy powder is about 97.0%.

12. A process as claimed in claim 11 wherein the amount by weight of boron in the alloy powder is 2.93% and the amount by weight of nickel in the alloy powder is 97.07%.

13. A process as claimed in claim 8 wherein the amount by weight of nickel is from 97.07% to 96.35% and the amount by weight of boron is from 2.93% to 3.65% by weight of boron.

14. A process for forming an electroconductive pattern according to claim 7, wherein said electroconductive pattern is a plasma display base.

15. A panel for plasma displays obtained by a process for forming an electroconductive pattern according to claim 14.

* * * * *